(12) United States Patent
Huang et al.

(10) Patent No.: US 6,295,727 B1
(45) Date of Patent: Oct. 2, 2001

(54) METHOD OF MANUFACTURING AN INTEGRATED CIRCUIT

(75) Inventors: Yao-Kui Huang, Taipei Hsien; Cheng-Fan Wang, Taipei, both of (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/227,373

(22) Filed: Jan. 8, 1999

(30) Foreign Application Priority Data

Aug. 28, 1998 (TW) ................................. 87114256

(51) Int. Cl.[7] ................................................. H05K 3/30
(52) U.S. Cl. ................................. 29/832; 29/840; 29/740
(58) Field of Search ......................... 29/830, 832, 840, 29/846, 827, 740

(56) References Cited

U.S. PATENT DOCUMENTS

| 3,986,335 | * | 10/1976 | Harper . | |
|---|---|---|---|---|
| 4,075,825 | * | 2/1978 | Murakami et al. . | |
| 4,086,696 | * | 5/1978 | Ikuta . | |
| 4,142,287 | * | 3/1979 | Grabbe | 29/827 |
| 4,196,577 | * | 4/1980 | Ohno et al. . | |
| 4,342,105 | * | 7/1982 | Dorfman . | |
| 4,391,531 | * | 7/1983 | Yokota et al. . | |
| 4,675,989 | * | 6/1987 | Galloway et al. | 29/827 |
| 4,796,239 | * | 1/1989 | Hayakawa et al. | 29/827 |
| 5,267,379 | * | 12/1993 | Pak | 29/827 |
| 5,403,782 | * | 4/1995 | Dixon et al. | 29/827 |

* cited by examiner

Primary Examiner—Carl J. Arbes
(74) Attorney, Agent, or Firm—Jiawei Huang; J. C. Patents

(57) ABSTRACT

A device and method for manufacturing an integrated real time clock integrated circuit (RTC IC) package is disclosed, in which the RTC IC and its related components are integrated into a single package. Therefore, the layout area required by the integrated RTC IC package is significantly reduced. Also, only a single manual assembling process is required. Furthermore, various examination steps are built into every process to manufacture the integrated RTC IC package to make sure the completed products are in normal condition. No extra examination and fix-up processes are required for the completed products so that manufacturing cost can be significantly reduced.

7 Claims, 7 Drawing Sheets

METHOD OF MANUFACTURING AN INTEGRATED CIRCUIT

CROSS-REFERENCE TO RELATED APPLICATION

This application claims the priority benefit of Taiwan application serial no. 87114256, filed Aug. 28, 1998, the full disclosure of which is incorporated herein by reference.

BACKGROUND OF THE INVENTION

1. Field of the Invention

The present invention generally relates to a real time clock integrated circuit (RTC IC), and more particularly to an integrated real-time clock integrated circuit device including a RTC and its related components and a method for manufacturing the same.

a device and method to integrate the RTC IC with its related components in a single package.

2. Description of the Related Art

Electrical appliances are widely used in the world. There is no exaggeration to say that these electrical appliances which provide great convenience to the human being are indispensable to the day-to-day life in this modern society.

One of the salient features of the electrical appliances is that most of them require a clocking function. For example, a clock circuit is required to automatically turn on and off a Hi-Fi or VCR. Also, commonly used personal computers are all embedded with a clock circuit, which operates to provide an accurate time even the main power of the computer is turned off. The operating system of the computer system can attach time information to a file when it is created or altered based on the clock function provided. Users can also distinguish the old files from the new ones according to the associated time stamp.

FIG. 1 is a circuit diagram of a clock circuit 100, including a real time clock integrated circuit (RTC IC) 110, a battery 134 and an oscillating circuit consisting of a quartz oscillator 131 and capacitors 132, 133. External control circuit, for example, a central processing unit (CPU) of a personal computer, can set parameters for the RTC IC 110 or read time information through a line 120. Note that the RTC IC 110 needs to keep operating to provide timing functions when the external power source is turned off. Therefore, the battery 134 is required to provide power for the RTC IC 110. The battery 134 can be a button-type lithium battery with a voltage of 3.0 V and a capacity of 50 mAH. The RTC IC 110 requires only a very small current to maintain operation thanks to the advancements in semiconductor technology. Therefore, the above-mentioned lithium battery can provide power to the RTC IC 100 for as long as two years. The quartz oscillator 131 provides a time base for the RTC IC 110. The capacitors 132 and 133 together with the quartz oscillator 131 constitute an oscillating circuit.

Although semiconductor technology has made significant progress recent years, the quartz oscillator and battery are nevertheless not integrated in the RTC IC 100. Furthermore, the capacitors 132 and 133 in the clock circuit 100 of FIG. 1 are closely related to the oscillating circuit based on the quartz oscillator 131, and therefore not integrated in the RTC IC 100 either. It is then inevitable to include the battery 134, quartz oscillator 131, and capacitors 132 and 133 in the clock circuit 100 when the RTC IC 100 is used.

In manufacturing the clock circuit 100, all the components, including the RTC IC 110, the battery 134, and quartz oscillator 131, require a manual assembly with an exception of the capacitors 132 and 133, which can be assembled automatically by using a surface mounted device (SMD) technology. The manual assembly of these components significantly increases the manufacturing cost. In addition, the installation of the battery 134 requires a battery holder, which also increases the manufacturing cost. Furthermore, when the assembling process is completed, an examination process is required to make sure the battery voltage is normal and the oscillating frequency is correct. If there is any abnormality occurred, a fix-up process is performed until everything is in normal condition. These extra examination and fix-up processes inevitably increase the manufacturing cost.

As a summary, the above-mentioned clock circuit using the RTC IC, quartz oscillator, capacitors, and battery has the following disadvantages:

1. The battery, quartz oscillator, and capacitors are not integrated with the RTC IC. Therefore, a large layout area on a printed circuit board (PCB) is required. Also, an extra battery holder is required in addition to a manual assembly to install the battery and the quartz oscillator, which increase manufacturing cost for the clock circuit.

2. When the clock circuit is assembled, extra examination and fix-up processes are required to make sure the battery voltage is normal and the generated signal frequency is correct. If there is any abnormality found during the examination process, further adjustment or repair need to be performed by engineers until the circuit is in normal condition. The involved examination and fix-up processes increase manufacturing cost as well.

SUMMARY OF THE INVENTION

It is therefore an objective of the present invention to provide a device and method for manufacturing an integrated RTC IC package, which integrate the RTC IC and its related components in a single package. Therefore, the layout area required by the cock circuit is significantly reduced. Furthermore, only a single manual assembling process is required to manufacture the integrated RTC IC package. Also, various examination steps are built into every process to manufacture the integrated RTC IC package to make sure the completed products are in normal condition. No extra examination and fix-up processes are required for the completed products so that manufacturing cost can be significantly reduced.

It is another objective of the present invention to provide a packaging cover having an appropriate supporting mechanism and directional marks corresponding to the RTC IC both inside and outside the packaging cover to facilitate the mounting of the RTC IC in the packaging cover. Also, users can easily identify the direction of the assembled RTC IC package with the help of the directional marks. Furthermore, the packaging cover is manufactured using a material of higher durability without producing scratches on the surface of the packaging cover.

In accordance with the foregoing and other objectives of the present invention, an integrated RTC IC package is provided, which includes a printed circuit board (PCB), a first capacitor, a second capacitor, a quartz oscillator, a battery, a packaging cover, and a RTC IC. The first capacitor, the second capacitor, and the quartz oscillator are soldered on the PCB. A plurality of pins of the RTC IC are lifted and bent upward before the IC pins are rectified. The PCB soldered with related components and the rectified RTC IC are soldered together. Positive and negative electrodes of the battery are soldered respectively to produce soldering points before soldering on the PCB.

The packaging cover is filled with an appropriate amount of gluing material. Subsequently, the RTC IC is mounted in the packaging cover to produce the integrated RTC IC package.

According to a preferred embodiment of the present invention, the battery is a button-type lithium battery.

Accordingly, a method for manufacture an integrated RTC IC package is provided, comprising the steps of:
providing a printed circuit board (PCB);
providing at least one capacitor soldered on the PCB;
providing a quartz oscillator soldered on the PCB;
examining soldering points to identify defective soldering points;
reworking the defective soldering points until the defective soldering points pass the examination;
providing a real time clock integrated circuit (RTC IC), wherein a plurality of pins of the RTC IC are bent upward and pins of the RTC IC are rectified;
soldering the PCB on a surface of the RTC IC;
providing a battery soldered on the PCB;
examining soldering points and measuring a battery voltage;
re-soldering the soldering points if the soldering points fail to pass the examination;
replacing the battery if the battery voltage is abnormal;
charging the battery;
measuring a signal frequency from the RTC IC and the battery voltage to identify abnormalities;
fixing up the abnormalities until the signal frequency from the RTC IC and the battery voltage are both correct;
providing a packaging cover and a gluing material;
filling the gluing material into the packaging cover;
assembling the packaging cover filled with the gluing material and the RTC IC soldered with related components to produce the integrated RTC IC package; and
drying out the integrated RTC IC package naturally.

Also, to facilitate the packaging of the RTC IC and its related components on its surface, a packaging cover is provided. The material used for manufacturing the packaging cover is a mixture of nylon and glass fiber. The packaging cover is designed to accommodate the IC and its related components on its surface. There is an external mark on the surface of the packaging cover to identify the direction of the RTC IC after packaging. There are a plurality of stop ribs, fastening ribs, and an internal mark inside the packaging cover. The stop ribs are situated inside the packaging cover with suitable length to stop the RTC IC and its related components to provide sufficient zoom for them when the RTC IC is mounted in the packaging cover. The fastening ribs are used to fasten the RTC IC with the packaging cover by positioning themselves between two adjacent pins of the RTC IC, so that the RTC IC does not shift relative to the packaging cover and consequently maintain a steady position within the packaging cover. The internal mark corresponding to the external mark is used to facilitate the packaging of the RTC IC into the packaging cover in a predetermined direction. According to a preferred embodiment of the present invention, the internal mark is one of the stop ribs, which is manufactured with a 15% of glass fiber.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
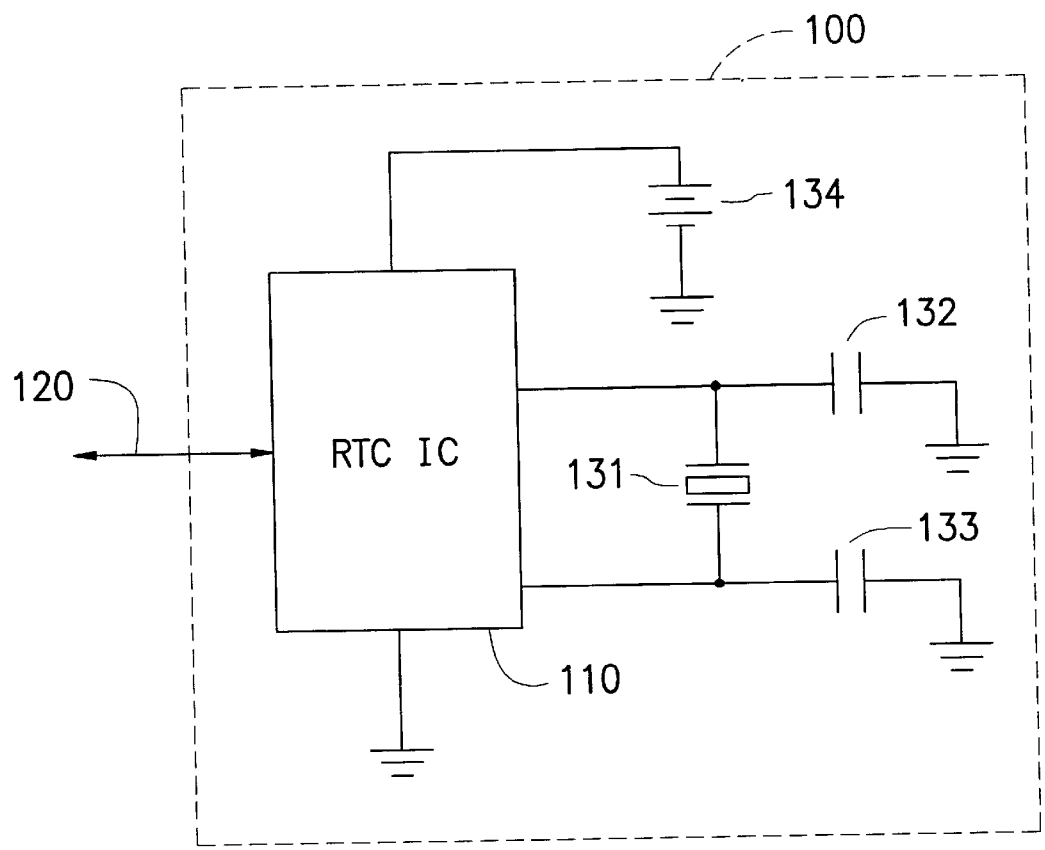
FIG. 1 is a circuit diagram of a clock circuit using a conventional real time clock integrated circuit (RTC IC)

Reference will now be made in detail to the present preferred embodiments of the invention, examples of which are illustrated in the accompanying drawings. Wherever possible, the same reference numbers are used in the drawings and the description to refer to the same or like parts.

Figure 2:
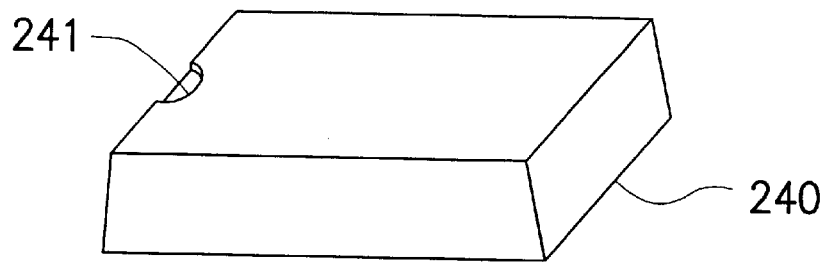
FIG. 2 is a diagram showing all the related components required to assemble an integrated RTC IC package according to a preferred embodiment of the present invention.
Figure 2:
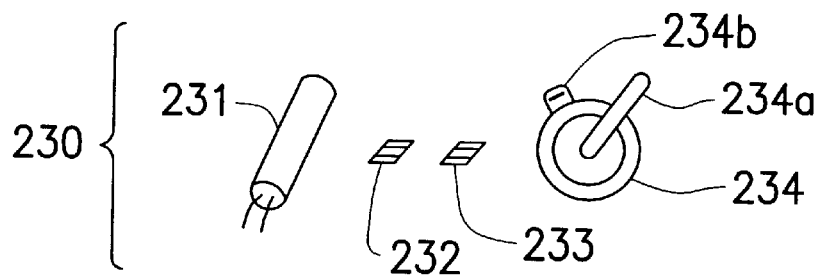
Figure 2:
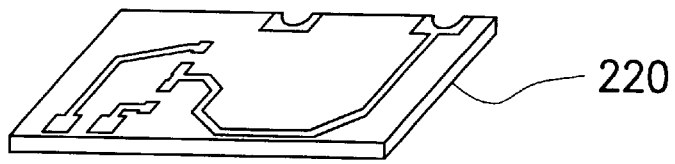
Figure 2:
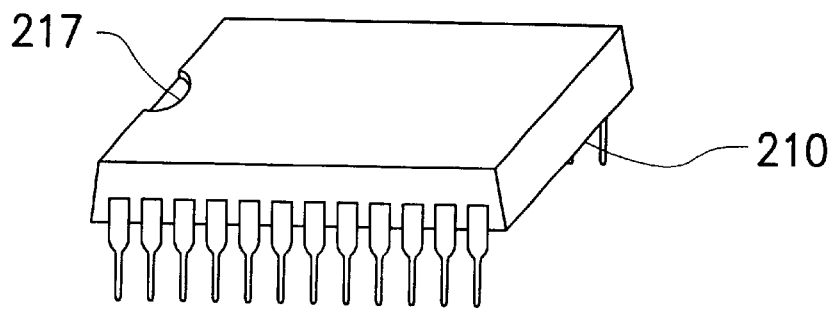

With reference to FIG. 2, all the related components required to assemble an integrated RTC IC package 200 are depicted according to a preferred embodiment of the present invention. The integrated RTC IC package 200 includes a RTC IC 210 having a directional mark 217, a PCB 220, related components 230, and a packaging cover 240 having a directional mark 241. The related components 230 include a quartz oscillator 231, capacitors 232 and 233, and a battery 234, which are all required to produce the integrated RTC IC package 200.

Figure 3:
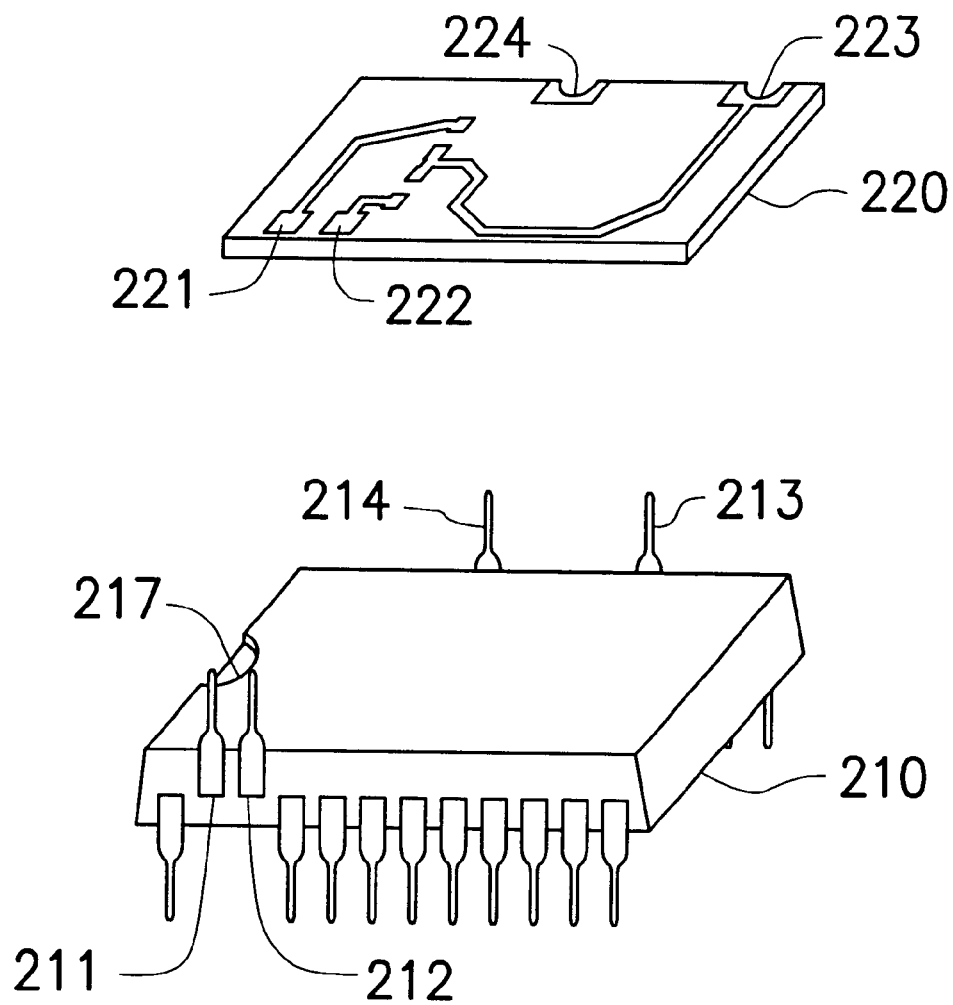
FIG. 3 is a diagram showing a process to bend pins of a RTC IC before an assembling process.

With reference to FIG. 3, a diagram showing a process to bend pins of a RTC IC 210 before an assembling process is depicted. Related components 230 are soldered on a PCB 220, which is subsequently assembled with the RTC IC 210. Note that a plurality of pins of the RTC IC 210 are lifted and bent upward to solder with soldering points on the PCB 220. As shown in FIG. 3, pins 211, 212, 213, and 214 of the RTC IC 210 are bent upward to connect the related components 230. Also, the shape of the PCB 220 needs to match that of the RTC IC 210. For example, the dimensions of the PCB 220 should be smaller or equal to those of the RTC IC 210. There are predetermined soldering points and openings on the PCB 220, which correspond to the bent pins of the RTC IC 210. For example, soldering points 221 and 222 are connected to the pins 211 and 212 of the RTC IC, while openings 223 and 224 match the pins 213 and 214 of the RTC IC 210.

To minimize size of the integrated IC package, smaller related components 230 are adopted. For example, surface mounted devices (SMD) are chosen for the capacitors 232 and 233. Therefore, an automatic assembling machine can be used to solder the capacitors 232 and 233 on the PCB 220 to reduce manual assembly required. After the SMD devices are assembled, manual assembly to mount the quartz oscillator 231 and the battery 234 on the PCB 220 is performed. A button-type battery can be used as the battery 234, which is soldered to produce soldering pints 234a and 234b on its positive and negative electrodes respectively to facilitate later assembly of the battery.

The RTC IC 210 can be assembled with the PCB 220 if the related components 230 are soldered on the PCB 220. The pins of the RTC IC 210 are rectified before the RTC IC 210 is assembled with the PCB 220 so that the integrated RTC IC package can be readily used in a circuit without going through another rectification process. That is, bent pins of the RTC IC 210 are soldered with the soldering points on the PCB 220. The battery 234 can be soldered on the PCB 220 after the RTC IC 210 is assembled with the PCB 220.

Figure 4:
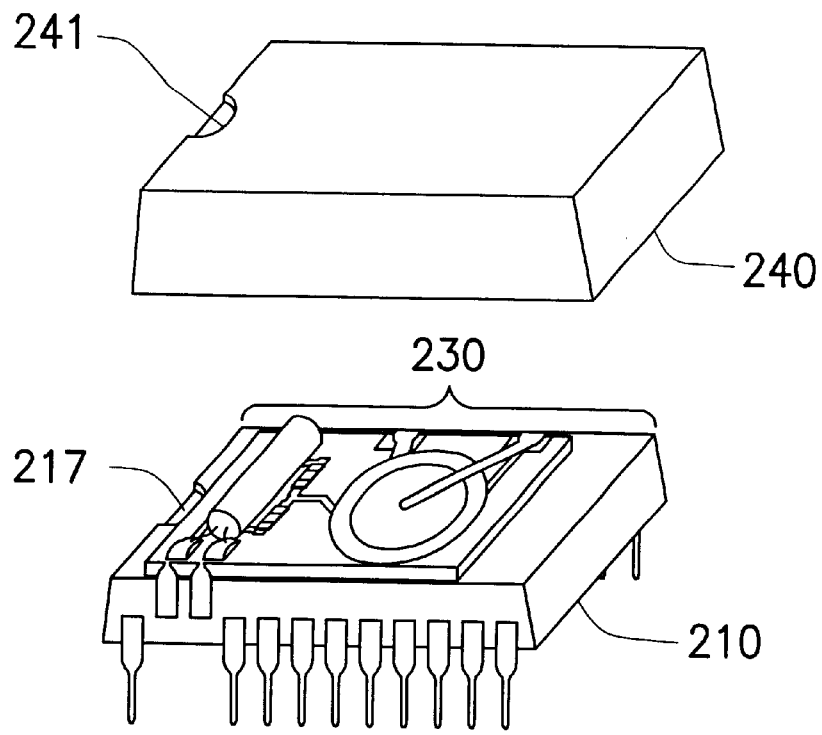
FIG. 4 is a diagram showing a RTC IC soldered with a printed circuit board (PCB) before mounting it in a packaging cover.

Refer is made to FIG. 4, which shows a RTC IC 210 soldered with a PCB before mounting it in a packaging cover. Note that the directional mark 241 on the packaging cover 240 needs to match the directional mark 217 of the RTC IC 210.

When the RTC IC 210 is soldered with the PCB 220 on which the related components 230 are soldered, the packaging cover 240 can then be mounted. Before the packaging cover 240 is mounted, an appropriate amount of gluing material is filled into the packaging cover 240. The assembled RTC IC 210 with related components is then mounted in the packaging cover 240. A certain period of time is allowed to naturally dry out the assembled integrated RTC IC package 200 shown in FIG. 5. Note that the gluing material filled into the packaging cover 240 helps immobilizing the assembled RTC IC 210 and the packaging cover 240. However, it depends on the actual situation if filling a gluing material into the packaging cover is necessary.

Figure 5:
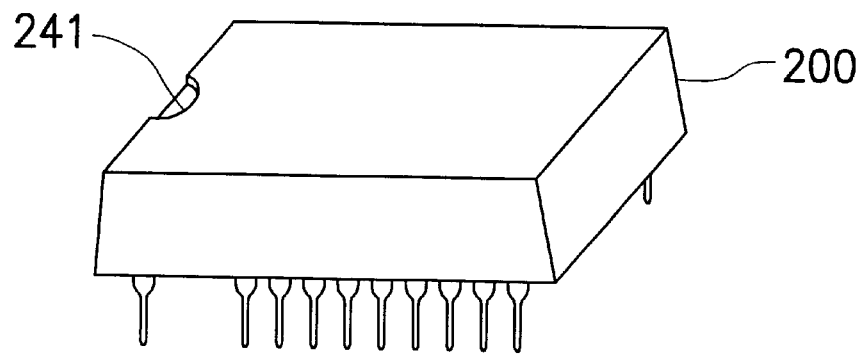
FIG. 5 is a diagram of a completed integrated RTC IC package according to a preferred embodiment of the present invention.

As mentioned earlier, the packaging cover 240 can be designed to significantly facilitate the IC packaging, which is further described hereinafter. As shown in FIGS. 4 and 5, the packaging cover 240 is used to accommodate the RTC IC 210 and its related components 230, which demands higher durability and better quality. After experimenting with many kinds of material, nylon mixed with 15% of glass fiber (GF) is chosen as the manufacturing material for the packaging cover 240. A comparison between the presented material with conventional PBT material is listed in Table 1 below:

TABLE 1

| Material Properties | Nylon + 15% GF | PBT |
| --- | --- | --- |
| Temperature (° C.) to thermal deformation | 240 | 163 |
| Impacting strength Kg/cm/cm | 8 | 5 |
| Stretching strength Kg/cm$^2$ | 1300 | 600 |
| Bending strength Kg/cm$^2$ | 1500 | 1000 |

TABLE 1-continued

| Material Properties | Nylon + 15% GF | PBT |
| --- | --- | --- |
| Dielectric strength KV/mm | 20 | 21 |
| Water-absorbing rate % | 1.5 | 0.08 |
| Fire-proof capability UL94 | V-0 | V-0 |

It is apparent that the material presented using nylon +15% GF is far better than the conventional PBT material as shown in Table 1 in the terms of the listed properties. Based on the presented material of nylon +15% GF, the packaging cover 240 is manufactured with superior qualities, such as shape formation, exterior quality, and printing durability, etc. Even in a poor working environment, these qualities are also exhibited. Especially, the packaging cover 240 made from the presented material is not easily deformed and maintains a nice look for a long time, because it possesses a higher hardness without being easily scratched. The packaging cover 240 is designed to accommodate the RTC IC 210 and its related components 230. There is an external mark 241 on the surface of the packaging cover 240. During the assembling process, the directional mark 217 of the RTC IC 210 needs to match the external mark 241 of the packaging cover 240, so that users can easily identify the direction of the RTC IC 210.

Figure 6A:
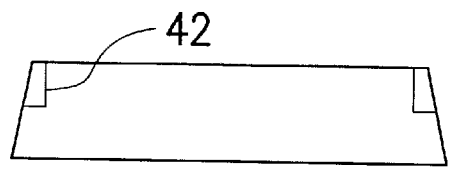
FIG. 6A is a cross sectional side view of a packaging cover.
Figure 6B:
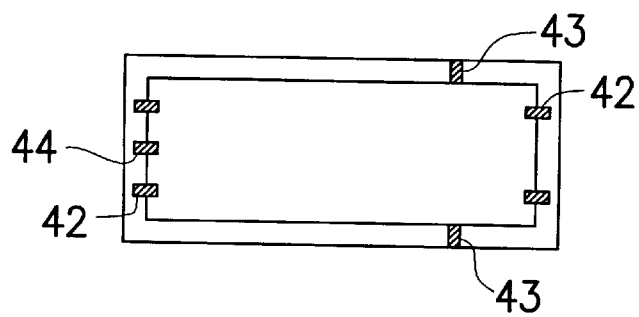
FIG. 6B is a bottom view of a packaging cover.
Figure 6C:
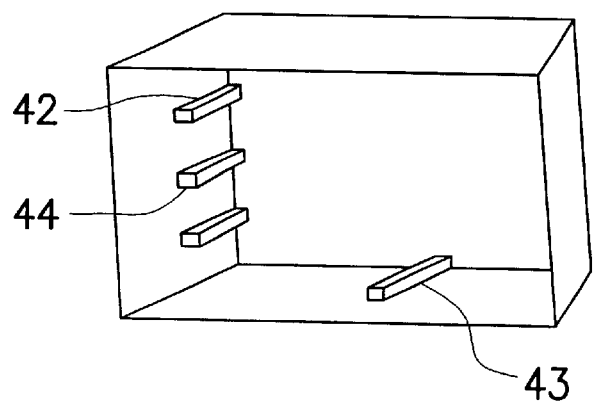
FIG. 6C is a perspective bottom view of a packaging cover.
Figure 7:
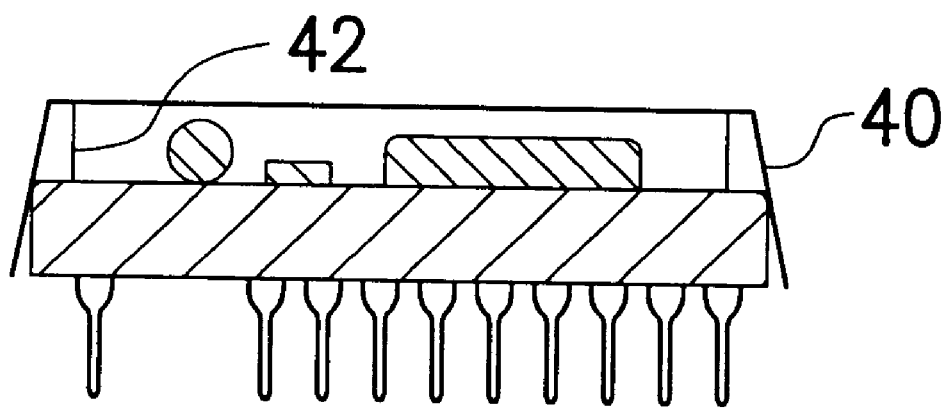
FIG. 7 is a cross sectional side view of a completed integrated RTC IC package according to a preferred embodiment of the present invention.

FIGS. 6A–6C are different views of the packaging cover 240. FIG. 6A shows a cross sectional side view of the packaging cover 240; FIG. 6B is a bottom view of the packaging cover 240; and FIG. 6C is a perspective bottom view of the packaging cover 240. FIG. 7, on the other hand, shows a cross sectional side view of a completed integrated RTC IC package 200 by assembling the RTC IC 210 and its related components 230 on a PCB 220, and the packaging cover 240 according to a preferred embodiment of the present invention.

As shown in FIG. 6B, the packaging cover 240 comprises an internal mark 244, a plurality of fastening ribs 243, and a plurality of stop ribs 242. The stop ribs 242 are situated inside the packaging cover 240 with suitable length to stop the RTC IC 210 and support the packaging cover 240 when the assembled RTC IC 210 is mounted in the packaging cover 240. Because of the stop ribs, there is a sufficient room between the surface of the RTC IC 210 and the packaging cover 240 to accommodate the related components 230 on the surface of the RTC IC 210. Also, the bottom of the RTC IC 210 needs to align with the edge of the packaging cover 240, so that the RTC IC 210 is not sunk into nor extruded the packaging cover 240. Although the stop ribs 242 are situated on the short sides of the packaging cover 240 according to a preferred embodiment of the present invention, it is not necessarily, however, for them to situate on the short sides. The position of these stop ribs can be adjusted depending on real requirements needed.

The use of the fastening ribs 243 is to immobilize the integrated RTC IC package assembled by the packaging cover 240 and the RTC IC 210 and its related components 230. The fastening ribs 243 in the preferred embodiment of the present invention are positioned between adjacent pins of the RTC IC 210 so as to fasten the RTC IC 210 on the packaging cover 240. However, the position and quantity of these fastening ribs 243 can be varied depending on practical requirements. Note that the stop ribs 242 an the fastening ribs 243 according to the preferred embodiment of the present invention are all in rectangular shape. However, the stop ribs 242 and fastening ribs 243 do not necessarily have to be rectangular as long as they can help facilitating the assembling of the packaging cover 240 and the RTC IC 210.

Note that the external mark 241 on the surface of the packaging cover 240 needs to match the directional mark 217 of the RTC IC 210 during the assembling process. Unfortunately, when operators are assembling the packaging cover 240 and the RTC IC 210, they can not easily identify the external mark 241 on the surface of the packaging cover 240. Therefore, an internal mark 244 corresponding to the external mark 241 inside the packaging cover 240 is provided to solve this problem. When the RTC IC 210 is mounted in the packaging cover 240, the operator can easily identify the direction of the packaging cover 240 to match the direction of the RTC IC 210 with the help of the internal mark 244. The internal mark 244 inside the packaging cover 240 can be designed in various ways according to practical requirements. In the preferred embodiment of the present invention, a stop rib on the short side of the packaging cover 240 is used as the internal mark 244 which corresponds to the external mark 241 on the surface of the packaging cover 240. It is then easy for the operator to identify the correct direction of the packaging cover 240 because the number of the stop ribs on the short sides of the packaging cover 240 are different.

In manufacturing the integrated RTC IC package 200 according to a preferred embodiment of the present invention, there are many quality control and examination steps built into so that the yield rate of this integrated RTC IC package 200 is close to 100%. The quality control and examination steps are illustrated by a flow chart in FIG. 8, which will be described in details hereinafter.

Figure 8:
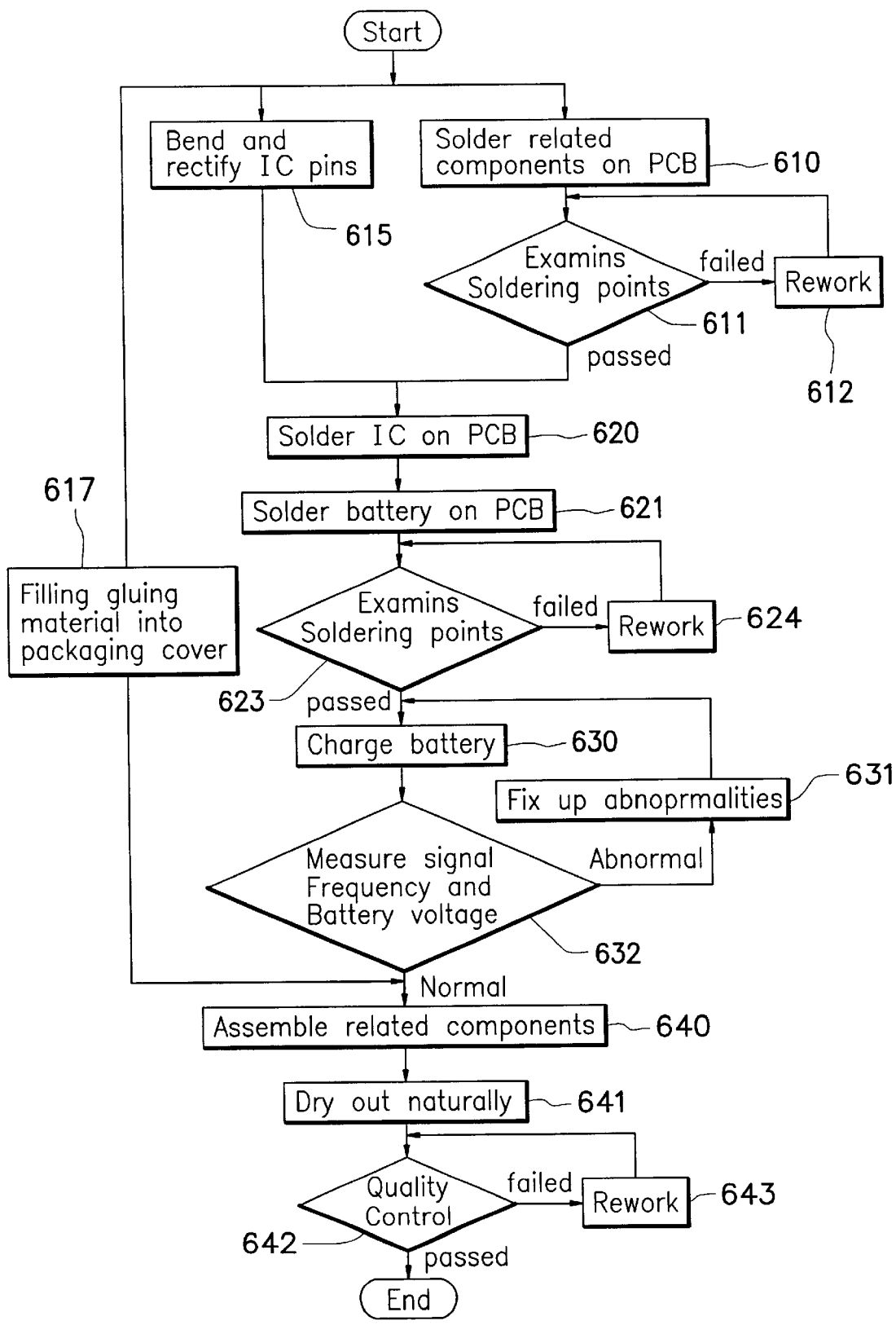
FIG. 8 is a flow chart showing steps to manufacture an integrated RTC IC package according to a preferred embodiment of the present invention.

As shown in FIG. 8, it is clear that some of the steps depend on previous steps, but some steps don't. For example, Steps 610 to 612 to solder the related components 230 on the PCB 220, Step 615 to bend and rectify IC pins, and Step 617 to fill a gluing material into the packaging cover 240 can all be concurrently performed by operators.

In Step 610, related components 230 depending on their characteristics are soldered on the PCB 220 in different ways. For example, a SMD operation is adopted to solder the capacitors 232 and 233 on the PCB 220. Subsequently, a general soldering process is performed to solder the quartz oscillator 231 on the PCB 220. The battery 234 is assembled on the PCB 220 in a subsequent step to come. In Step 611, quality control personnel examine the soldering points between the related components 230 and the PCB 220. If the soldering points fail to pass the examination, they are sent back for reworking in Step 612 until all the soldering points pass the examination.

Step 615 can be performed concurrently with the Step 610, in which a plurality of pins of the RTC IC 210 are bent upward before all the IC pins are rectified.

In Step 620, the rectified RTC IC 210 is assembled with the PCB 220 on which related components 230 are soldered. Step 621 is to solder the battery on the assembled PCB 220. In Step 623, an examination for the soldering points among the RTC IC 210, PCB 220, and the battery 234 is performed. If there is any soldering point which fails to pass the examination, the assembled device is sent back for reworking in step 624 until all the soldering points pass the examination.

In Step 630, a charging process is performed to trigger the internal circuits within the RTC IC 210 to work.

In Step 632, measurements from the RTC IC 210 and the battery 234 are taken to check if the signal frequency from the RTC IC 210 is correct and the battery voltage is normal. If the signal frequency or the battery voltage is abnormal, a fix-up process is performed in Step 631, including re-soldering or replacing defective components. Subsequently, an examination process is performed again until the signal frequency and battery voltage are both in normal condition.

In Step 617, a gluing material is filled into the packaging cover 240 concurrently with the above-mentioned steps. In Step 640, the assembled device, including the RTC IC 210, is mounted in the packaging cover 240 that is filled with an appropriate amount of gluing material. In Step 641, the integrated RTC IC package by mounting the assembled RTC IC 210 in the packaging cover 240 is placed for a certain period of time to allow natural dry-out. The drying out time depends on the gluing material used. Generally, it takes 8 to 12 hours to dry out the completed integrated RTC IC package naturally.

Step 642 is a quality control process, including an exterior examination and a final quality check-up for the completed integrated RTC IC packages stored in an IC container. First of all, an exterior examination is performed after the integrated RTC IC package is dried out. If the integrated RTC IC package fails to pass the examination, it is then sent back for reworking in Step 643. When the integrated RTC IC packages pass the exterior examination, they are stored in an IC container in a certain quantity, for example, 17 integrated RTC IC packages in an IC container. The integrated RTC IC packages within the IC container are sampled for another quality control check-up before delivery. For example, 125 samples are taken among 1000 integrated RTC IC packages. If there is any integrated RTC IC package in the samples fails to pass the examination, the whole batch of the integrated RTC IC packages is rejected and sent back for reworking in Step 643 so that the yield rate achieved is close to 100%.

Although examinations for components from the manufacturers, for example, batteries, PCBs, capacitors, and packaging covers, are not described. It is understood that examination processes can be established for these components before they can be used in manufacturing the integrated RTC IC package. If the failure rate of the components during the examination exceeds a certain percentage, these components are returned to the manufacturers, so that the completed integrated RTC IC package is able to maintain a better quality and higher yield rate.

The device and method for manufacturing the integrated RTC IC package according to the preferred embodiment of the present invention integrate 6 separate components into a single package. Therefore, the layout area required on the PCB is significantly reduced and so is the manual assembly. Also, the PCB is designed in such a way that separate components can be easily assembled on. Therefore, the method for manufacturing an integrated RTC IC package according to the preferred embodiment of the present invention can significantly enhance the quality of the products produced.

From the above-mentioned descriptions, the device and method for manufacturing the integrated RTC IC package according to the preferred embodiments of the present invention has the following advantages:

1. The battery quartz oscillator, capacitors, and the RTC IC are integrated into a single package, which occupies an area of only an IC on the PCB. There is no need to use a battery holder. Furthermore, only one component requires manual assembly. Therefore, the cost for manufacturing the integrated RTC IC package is significantly reduced.

2. There are various examination processes involved during the manufacturing process of the integrated RTC IC package. Therefore, the produced products are very stable and possess good quality. The yield rate of the products produced is close to 100%. No extra examination step is required in practical applications before using the integrated RTC IC package to have a normal operation. The examination and fix-up processes can be significantly reduced, so that the manufacturing cost is also reduced.

3. Users can easily identify the correct direction of the RTC IC package when mounting the RTC IC in the packaging cover because of the external mark on the surface of the packaging cover which corresponds to the direction of the RTC IC. Also, an internal mark inside the packaging cover is used to facilitate the identification of the correct direction to mount the RTC IC in the packaging cover during the assembly process. Furthermore, there are stop and fastening ribs within the packaging cover, which help immobilizing the assembled RTC IC within the packaging cover. Because of the superior quality of the manufacturing material used, the hardness of the packaging cover is very high so that scratches on the surface of the integrated RTC IC package can be minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing an integrated RTC IC package, the method comprising the steps of:

providing a printed circuit board (PCB);

soldering at least one capacitor soldered on the PCB with soldering points;

soldering a quartz oscillator soldered on the PCB with soldering points;

examining the soldering points to identify defective soldering points;

reworking the defective soldering points until the defective soldering points pass the examination;

providing a real time clock integrated circuit (RTC IC), wherein a plurality of pins of the RTC IC are bent upward and the RTC IC pins are rectified;

soldering the PCB on a surface of the RTC IC with soldering points;

providing a battery soldered on the PCB with soldering points;

examining the soldering points and measuring a battery voltage;

re-soldering the soldering points if the soldering point fails to pass the examination;

replacing the battery if the battery voltage is abnormal;

charging the battery;

measuring a signal frequency from the RTC IC and the battery voltage to identify abnormalities;

fixing up the abnormalities until the signal frequency from the RTC IC and the battery voltage are both correct;

providing a packaging cover and a gluing material;

filling the gluing material into the packaging cover;

assembling the packaging cover filled with the gluing material and the RTC IC soldered with related components to produce the integrated RTC IC package; and drying out the integrated RTC IC package naturally.

2. The method of claim 1, wherein the soldering points are examined for each component soldered and a reworking process is performed for soldering points which fail to pass the examination.

3. The method of claim 1, wherein the signal frequency from the RTC IC and the battery voltage are measured to identify any abnormalities, wherein a fixing-up process is performed if the abnormalities exist until the signal frequency from the RTC IC and the battery voltage are both correct to guarantee the integrated RTC IC package is in normal condition.

4. A method for manufacturing an integrated RTC IC package, the method comprising the steps of:

providing a real time clock integrated circuit (RTC IC), a battery, a printed circuit board (PCB), at least one capacitor, and a quartz oscillator, all of which are soldered on the PCB with soldering points;

examining the soldering points to identify defective soldering points;

reworking the defective soldering points until the defective soldering points pass the examination;

measuring a battery voltage;

replacing the battery if the battery voltage is abnormal;

charging the battery;

measuring a signal frequency from the RTC IC and the battery voltage to identify abnormalities;

fixing up the abnormalities until the signal frequency from the RTC IC and the battery voltage are both correct; and providing a packaging cover, wherein the RTC IC soldered with related components is mounted in the packaging cover.

5. The method of claim 4, wherein the capacitor and the quartz oscillator are soldered on the PCB to produce soldering points, wherein the soldering points are examined to identify defective soldering points, wherein a reworking process is performed for the defective soldering points which fail to pass the examination.

6. The method of claim 5, wherein the PCB is soldered on a surface of the RTC IC and the battery is soldered on the PCB when the examination of the soldering points of the capacitor and the quartz oscillator soldered on the PCB is passed.

7. The method of claim 4 further provides a gluing material, wherein the packaging cover is filled with an appropriate amount of the gluing material before the RTC IC soldered with related components is mounted in the packaging cover.

* * * * *